United States Patent [19]

Fujisaki et al.

[11] Patent Number: 5,208,066
[45] Date of Patent: May 4, 1993

[54] PROCESS OF FORMING A PATTERNED POLYIMIDE FILM AND ARTICLES INCLUDING SUCH A FILM

[75] Inventors: Koji Fujisaki; Shunichi Numata, both of Hitachi; Takao Miwa, Katsuta; Takayoshi Ikeda, Ibaraki; Hisae Shimanoki, Hitachi, all of Japan

[73] Assignee: Hitachi, Ltd., Tokyo, Japan

[21] Appl. No.: 877,391

[22] Filed: Apr. 30, 1992

Related U.S. Application Data

[63] Continuation of Ser. No. 494,666, Mar. 16, 1990, abandoned.

[30] Foreign Application Priority Data

Mar. 18, 1989 [JP] Japan .................................. 1-66776

[51] Int. Cl.$^5$ .............................................. C23C 26/00
[52] U.S. Cl. .................................. 427/96; 427/407.1; 427/131; 427/282; 427/340; 437/52; 437/195; 437/211
[58] Field of Search .............. 427/96, 407.1, 131, 427/282, 340; 437/52, 195, 211

[56] References Cited

U.S. PATENT DOCUMENTS

| | | | |
|---|---|---|---|
| 3,179,630 | 4/1965 | Endrey | 525/305 |
| 4,238,528 | 12/1980 | Angelo | 427/96 |
| 4,317,700 | 3/1982 | Tanaka | 427/96 |
| 4,347,306 | 8/1982 | Takeda | 427/96 |
| 4,379,833 | 4/1983 | Canavello | 427/96 |
| 4,436,583 | 3/1984 | Saiki | 156/668 |
| 4,468,411 | 8/1984 | Sloan | 427/96 |
| 4,508,766 | 4/1985 | Inaike | 427/96 |
| 4,654,223 | 3/1987 | Araps | 427/96 |
| 4,656,050 | 4/1987 | Araps | 427/96 |
| 4,686,147 | 8/1987 | Matsuyama | 427/131 |
| 4,699,803 | 10/1987 | Araps | 427/96 |
| 4,725,504 | 2/1988 | Knudsen | 428/675 |
| 4,806,395 | 2/1989 | Walsh | 427/306 |
| 4,885,038 | 12/1989 | Anderson, Jr. | 156/89 |
| 4,910,293 | 3/1990 | Uekita | 427/402 |
| 4,943,471 | 7/1990 | Uekita | 428/411.1 |

OTHER PUBLICATIONS

M. M. Koton et al., "Investigation of the Kinetics of Chemical Imidization", USSR Polymer Science, vol. 24, 1982, pp. 791-800.

*Primary Examiner*—Shrive Beck
*Assistant Examiner*—Vi Duong Dang
*Attorney, Agent, or Firm*—Antonelli, Terry, Stout & Kraus

[57] ABSTRACT

A process of forming a patterned polyimide film includes the step of conversion of a polyimide precursor into polyimide. The improvement is imidizing the precursor by means of a chemical imidizing reagent. Typically a film of polyimide precursor is formed on a substrate, and mask which is negative with respect to the desired pattern is formed on the film. The film is contacted through the mask with a chemical imidizing reagent to effect imidization of unmasked portions, thereby forming polyimide. The mask and masked portions of the film are removed, leaving the desired polyimide pattern. High temperatures and harmful etchants can be avoided.

36 Claims, 3 Drawing Sheets

PROCESS OF FORMING A PATTERNED POLYIMIDE FILM AND ARTICLES INCLUDING SUCH A FILM

This application is a continuation of application Ser. No. 07/494,666, filed Mar. 16, 1990 abandoned.

BACKGROUND OF THE INVENTION

1. Field of the Invention

This invention relates to a process of forming a patterned polyimide film by chemical conversion of a polyimide precursor into polyimide. The invention also relates to the manufacture of articles containing such a film, and to the articles themselves.

2. Description of the Prior Art

Polyimide thin layers are useful in many electronic devices and other miniaturized devices, especially those made by thin layer technology such as semiconductor devices, semiconductor memories and circuit boards. Polyimide has the advantage of high thermal stability and low dielectric constant. The known methods for forming a patterned polyimide film are punching, etching and photolithography using photosensitive polyimide.

An example of selective etching of a polyimide film using a mask is disclosed in U.S. Pat. No. 4,436,583. This is a wet etching process. Etching methods can be classified into wet methods and dry methods. In the wet method, the molecular chains of polyimide are dissociated and removed using an alkaline etching solution such as an aqueous solution of NaOH, KOH or hydrazine. The disadvantages of wet etching are that the etching rate varies greatly with different kinds of polyimide, and that there is a risk of delamination of the mask because a long etching time is required when film thickness is large. There is also the disadvantage that the etching liquid contaminates the device being manufactured, and particularly that hydrazine, which is used in the process of U.S. Pat. No. 4,436,583, is highly poisonous to the human body and raises a problem of environmental pollution.

In dry etching, the etching is effected using plasma or ions of oxgyen or a mixture of fluorocarbon and oxygen. Dry etching of polyimide takes a longer time than wet etching and also has the problem that it may damage the device, e.g. a semiconductor element, being formed.

A method involving punching of the polyimide film can be used when forming a flexible printed circuit board or a carrier for a semiconductor device, but has the disadvantages of inferior dimensional accuracy and that a pattern cannot be formed while the polyimide film is located on an electronic device.

Polyimide films for punching or etching have been made by heating a film of polyimide precursor material, to cause formation of the imide rings. Photolithography using photosensitive polyimide also uses heating to form the polyimide ring structure, but forms a pattern of the precursor before the heating stage. A layer of photosensitive polyimide precursor in the form of a polyamic acid having photosensitive functional groups is formed on the substrate and is exposed through a mask. Since the polyimide precursor is photosensitive, a photoresist mask cannot be used, and instead a layer of glass having a metal layer defining the pattern is used as the mask. The radiation used causes cross-linking of photosensitive functional groups in the polyamic acid. Solvent then removes the masked areas which have not been cross-linked, and the remaining pattern is heated to form polyimide.

A problem with this photolithography process is that when the film is thick there is insufficient transmission of light to expose the full thickness of the layer, and even when a thin film is used there is difficulty in forming a fine pattern.

The use of heat to form the polyimide layer is also a disadvantage, if it might cause damage to the product being made.

SUMMARY OF THE INVENTION

An object of the present invention is to provide a process of making a patterned polyimide film which can avoid prior art disadvantages as set out above and in particular can avoid the use of heat where this is disadvantageous and the use of harmful hydrazine. It is also an object to provide a process which can form thick patterned polyimide films, and can form thick or thin films with precision.

The present invention consists in the use of a chemical imidizing agent to convert a polyimide precursor into a polyimide pattern. Thus the imidizing agent is brought into contact with the desired pattern region of the precursor film, to effect imidization to form the polyimide pattern. While it is possible to form the pattern after the precursor film has been converted to polyimide, it is most suitable to convert only the pattern, and this is conveniently done using a mask through which the imidizing agent contacts the precursor film.

Although the use of a chemical imidizing agent to form a polyimide from precursor has been known for some time, the amount of literature is very small and the process seems to have used in practice only in a few special cases. The conventional process of imidization has always been by heating. Chemical imidization is disclosed in for example, "Experimental and Theoretical Study of the Effect of Medium on Chemical Imidization" by M. M. Koton, USSR Polymer Science Volume 26 No 12 Page 2839 (1984).

In the Japanese journal Sen-i Gakkaishhi, Volume 40, No 12, page T480 "High tenacity and high modulus fibers from wholly aromatic polyimides" by T. Jinda, et. al., there is described the chemical conversion of partially imidized polymer fibers by immersion in an acidic anhydride-pyridine mixture and heat drawing. It is believed that the chemical conversion occurs only at the surface of the fibre in such a process. A similar process forming a continuous polyimide sheet which is subsequently rolled up is also thought to have been used.

In the Journal of the Chemical Society of Japan, 1987 (11) pages 2174 to 9, Nishikata et. al. describe the formation of a very thin film (Langmuir-Blodgett film) of polyimide by chemical imidization on plates for a liquid crystal. The polyimide forms the liquid crystal alignment layer, to achieve orientation of the liquid crystal material. This involves very thin (e.g. 0.01 microns) unpatterned layers.

The present inventors have surprisingly found that chemical imidization can successfully be used to convert the full thickness of a precursor layer, using a mask. Thus in this instance it is possible to use a chemical reagent to perform a chemical reaction in order to convert a patterned layer. This is in contrast to etching, where the etchant chemically acts upon the surface layer and removes it. The significant finding of the present inventors is that diffusion of the imidizing agent through the complete layer thickness, even of thick films, can be achieved, to cause imidization of the complete thickness of the layer. Before the inventors' investigations, it was not apparent that this would take place. It has also been found that the edge of the pattern, when the unimidized portions of a layer are removed, is of good quality. Here again there is a contrast with etching, in that etching through a mask removes the portion left exposed by the mask, whereas the chemical imidization converts the portion exposed by the mask (i.e. the reagent reacts with the precursor to effect imidization), and the unconverted portion is subsequently removed.

It has also be found that the presence of residual imidizing reagent does not cause problems, and that the by-products of chemical imidization, in particular acetic acid, do not cause difficulty in subsequent processing or can easily be removed.

The invention can thus be defined in another aspect as providing an article, e.g. an electronic device, having a patterned polyimide layer containing residual imidizing reagent.

An advantage of the present invention is that the chemical imidization can be performed at relatively low temperatures, e.g. room temperature. Thus, damage to sensitive components can be avoided. The preferred temperature range is $-20°$ to $100°$ C., more preferably $0°$ to $80°$ C. The contact time of the imidizing agent with the precursor film should be sufficient to effect the imidization to the desired extent, i.e. to allow diffusion of imidization agent through the thickness of the film.

The imidizing reagent is in general a liquid, and may be a solution of the active imidizing reagent or reagents. Preferably the diffusion rate of the imidizing agent in the mask is less than its diffusion rate in the precursor material, preferably not more than one-third of its diffusion rate in the precursor material.

Washing of the chemically imidized film with solvent may take place, to remove imidizing reagent and by-products. An aqueous material may be used to remove acetic acid, and an appropriate solvent to remove pyridine.

In the invention, use of harmful etchants can be avoided.

To improve the chemical property of the imidized film, it is preferable to heat it above its glass trasition temperature Tg.

The polyimide precursor film subjected to the patterned chemical imidization may be partially pre-imidized, either by application of a solution of partially imidized material or by heating a precursor after application in order partially to imidize it.

The mask may be removed simultaneously with the unimidized precursor, or the mask and the unimidized precursor may be removed separately in a two-step process. One preferred form of mask is made of metal, since this has very low diffusion rate for the imidizing agent. Another preferred mask is a novolak type resin.

The number of process steps in the present invention can be fewer, compared with etching processes.

While the invention is in principle widely applicable, it can be used to produce relatively thick patterned layers of polyimide, and a preferred minimum thickness is 1 micron. Compared with etching processes, very thick polyimide layers, e.g. 50 microns, can be produced. Likewise, the invention finds special advantage when applied to micropatterns, i.e. patterns which have at least one pattern width of less than 50 microns. The term "pattern width" here means either the width of a pattern portion or the width of a hole or gap between two pattern portions.

The polyimide precursor is generally a polyamic acid, a derivative of a polyamic acid or an esterified polyamic acid. In case of polyamic acids or esterified polyamic acids, the precursor should have a intrinsic viscosity of 0.3 to 5.0 dl/g when 0.5% by weight of the precursor is dissolved in N-methyl pyrrolidone at a temperature of 30° C.

Such polyamic acids or esters thereof may be considered for example as a polymer of an aromatic aminocarboxylic acid or ester or derivative thereof or a polymer of an aromatic diamine with an aromatic tetracarboxylic acid or ester or derivative thereof. Such precursors include those having repeating units of one of the following structures I and II:

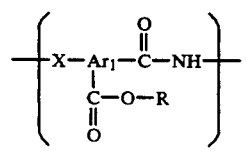

wherein
X may be absent or is a divalent organic radical, preferably aromatic;
$Ar_1$ is a trivalent aromatic group;
R is hydrogen or an alkyl group(substituted or unsubstituted), preferably hydrogen or $C_{1-4}$; and

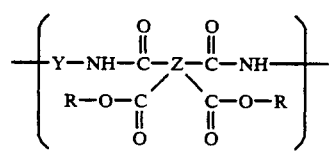

wherein
Y is a divalent organic radical preferably aromatic;
Z is a tetravalent organic radical preferably aromatic;
each R is as defined for I.
Preferably $Ar_1$ and Z are such that, on imidization, 5 or 6 membered imide rings are formed.

I is preferably

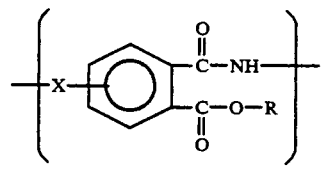

In II, Z is typically aromatic, preferably one of

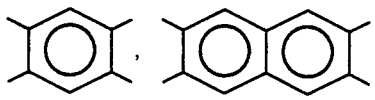

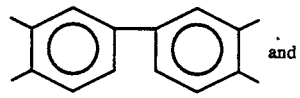

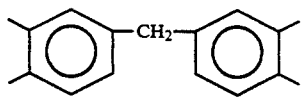

in each case either unsubstituted or substituted.

Such polyimide precursor can be obtained by the homopolymerization of an aromatic aminodicarboxylic acid derivative or by the reaction of aromatic diamine with tetracarboxylic acid derivative. This acid derivative is exemplified by esters, anhydrides and acid chlorides. The use of anhydride is especially preferable for the synthesis.

Specific examples of the aforementioned derivatives of aminocarboxylic acid are:
4-amino-phthalic acid;
4-amino-5-methylphthalic acid;
4-(p-anilino)phthalic acid;
4-(3,5-dimethyl-4-anilino)phthalic acid;
or their ethers, anhydrides or acid chlorides.

The aromatic diamine is exemplified by:
p-phenylenediamine,
2,5-diaminotoluene,
2,5-diaminoxylene,
diaminodurene(2,3,5,6-tetramethylphenylene-diamine)
2,5-diaminobenzotrifluoride,
2,5-diaminoanisole
2,5-diaminoacetophenone,
2,5-diaminobenzophenone,
2,5-diaminodiphenyl,
2,5-diaminofluorobenzene,
benzidine,
o-tolidine,
m-tolidine,
3,3′,5,5′-tetramethylbenzidine,
3,3′-dimethoxybenzidine,
3,3′-di(trifluoromethyl)benzidine,
3,3′-diacetylbenzidine,
3,3′-difluorobenzidine,
octafluorobenzidine,
4,4″-diaminoquaterphenyl, or
4,4‴-diaminoquaterphenyl,
all having a linear conformation;
m-phenylenediamine,
4,4′-diaminodiphenylmethane,
1,2-bis(anilino)ethane,
4,4′-diaminodiphenylether,
diaminodiphenyl sulfone,
2,2-bis(p-aminophenyl)propane,
2,2-bis(p-aminophenyl)hexafluoropropane,
3,3′-dimethyl-4,4′-diaminodiphenyl ether,
3,3′-dimethyl-4,4′-diaminodiphenylmethane,
diaminotoluene,
diaminobenzotrifluoride,
1,4-bis(p-aminophenoxy)benzene,
4,4-bis(p-aminophenoxy)biphenyl,
hexafluoropropane,
2,2-bis[4-(p-aminophenoxy)phenyl]propane,
2,2-bis[4-(m-aminophenoxy)phenyl]propane,
2,2-bis[4-(p-aminophenoxy)phenyl]hexafluoropropane
2,2-bis[4-(m-aminophenoxy)phenyl]hexafluoropropane
2,2-bis[4-(p-aminophenoxy)-3,5-hexafluoropropane,
2,2-bis[4-(p-aminophenoxy)-3,5-ditrifluoromethylphenyl]hexafluoropropane,
p-bis(4-amino-2-trifluoromethylphenoxy)benzene
4,4′-bis(4-amino-2-trifluoromethylphenoxy)-biphenyl,
4,4′-bis(4-amino-3-trifluoromethylphenoxy)-biphenyl,
4,4′-bis(4-amino-2-trifluoromethylphenoxy)-biphenyl sulfone,
4,4′-bis(3-amino-5-trifluoromethylphenoxy)-biphenyl sulfone,
2,2-bis[4-(p-amino-3-trifluoromethylphenoxy)-phenyl]-hexafluoropropane,
diaminoanthraquinone,
4,4-bis(3-aminophenoxyphenyl)diphenyl sulfone,
1,3-bis(anilino)hexafluoropropane,
1,4-bis(anilino)octafluorobutane,
1,5-bis(anilino)decafluoropentane,
1,7-bis(anilino)tetradecfluoroheptane,
diamino-siloxane, as represented by the following general formula:

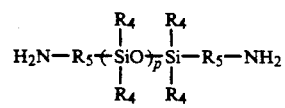

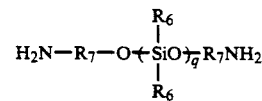

(wherein: $R_5$ and $R_7$ each represents a divalent aromatic group; $R_4$ and $R_6$ each represents a monovalent aromatic group; and p and q each represents an integer of 1 or more).

Derivatives of tetracarboxylic acid for use in the present invention are exemplified by:
pyromellitic acid,
methylpyromellitic acid,
dimethylpyromellitic acid,
di(trifluoromethyl)-pyromellitic acid,
3,3′,4,4′-biphenyltetracarboxylic acid,
5,5′-dimethyl-3,3′,4,4′-biphenyltetracarboxylic acid,
p-(3,4-dicarboxyphenyl)benzene,
2,3,3′,4′-tetracarboxydiphenyl,
3,3′,4,4′-tetracarboxydiphenyl ether,
2,3,3′,4′-tetracarboxydiphenyl ether,
3,3′,4,4′-tetracarboxybenzophenone,
2,3,3′,4′-tetracarboxybenzophenone,
2,3,6,7-tetracarboxynaphthalene,
1,4,5,7-tetracarboxynaphthalene,
1,2,5,6-tetracarboxynaphthalene,
3,3′,4,4′-tetracarboxydiphenylmethane,
2,3,3′,4′-tetracarboxydiphenylmethane,
2,2-bis(3,4-dicarboxyphenyl)propane,
2,2-bis(3,4-dicarboxyphenyl)hexafluoropropane,
3,3′,4,4′-tetracarboxydiphenyl sulfone,
3,4,9,10-tetracarboxyperylene,
2,2-bis[4-(3,4-dicarboxyphenoxy)phenyl]-propane,
2,2-bis[4-(3,4-dicarboxyphenoxy)phenyl]-hexafluoropropane,
butanetetracarboxylic acid, and
cyclopentanetetracarboxylic acid,
and their anhydrides, acid chlorides or esters.

The synthesis of the aforementioned precursor is preferably accomplished at a temperature ranging from −20° to 200° C. in a solution in N-methyl-2-pyrrolidone (NMP), dimethylformamide (DMF), dimethylacetamide (DMAC), dimetyl sulfoxide (DMSO), dimethyl sulfate, sulfolane, butyrolactone, cresol, phenol, halogenated phenol, cyclohexanone, dioxane, tetrahydrofuran or acetophenone.

In the present invention, as mentioned, the precursor is not limited to a complete polyamic acid or its derivative but may be pre-imidized to some extent. This partially imidized polyamic acid is preferable because it is hardly affected by the solvent or the like in a resist. If, however, the imidization proceeds excessively, it becomes difficult later to remove the mask or the polyimide precursor portion which has been prevented from being imidized by said mask.

If, on the other hand, the film of the coated precursor is tacky, this tackiness will adversely affect formation of the mask pattern.

The thickness of the precursor film on the substrate should be 0.05 to 70 μm in general. In case of orientation films for liquid crystal display devices, the thickness should preferably be 0.05 to 0.2 μm. In case of multi-layered insulating films for integrated circuit elements, each of the insulating films should preferably have a thickness of 0.2 to 2 μm. In an application of alpha ray shielding for memory devices, the thickness of the precursor films should preferably have a thickness of 2 to 50 μm. The width of the precursor film should have about two times or more of the thickness of the film.

In the present invention, if the adhesion between the polyimide film and the substrate carrying said film is required, the substrate surface is desirably roughened or treated, if it is inorganic, with a silane coupling agent, a titanate coupling agent, an aluminium alcoholate, an aluminium chelate, a zirconium chelate or aluminium acetylacetone. Moreover, these surface treating agents may be added to the polyimide.

In the present invention, in order to control the fluidity of the precursor or to adjust its coefficient of thermal expansion or its modulus of elasticity, it is conceivable to mix in powder, fibre or chopped strand of inorganic, organic or metallic material.

The polyimide precursor film can be formed by conventional sp in coating or printing methods.

The imidizing reagent used in the present invention is exemplified by acetic anhydride/pyridine, trifluoroacetic anhydride/pyridine, triphenyl phosphite/tertiary amine (such as pyridine, trimethylamine or imidazole), carbodiimide, cyanamide, inamine or alkoxyacetylene. Preferred are mixtures of acid anhydride and tertiary amine. The imidizing reagents are so-called dehydrating reagents or de-alcohol reagents. As is disclosed in su as M. M. Koton, et al, USSR Polymer Science, vol. 24, pp. 791 (1982) for instance, it is said that the reaction of imidization takes place in the following mechanism.

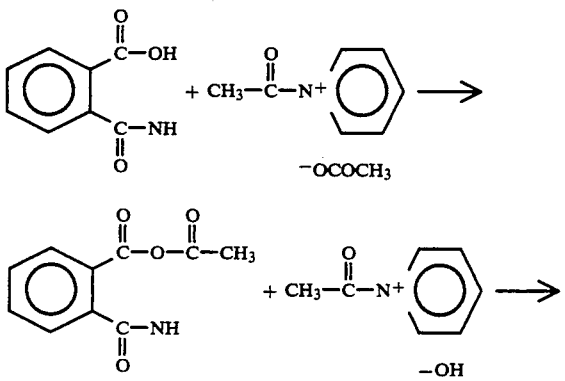

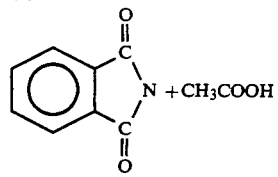

In the present invention another type of imidizing agents can be used. In that case, the mechanism of imidization would be different from the above mentioned one.

Such imidizing agents may be used alone or diluted in a solvent which will not dissolve the mask.

Typically after the mask pattern has been formed, the precursor film is imidized by dipping it in the aforementioned imidizing reagent. Thus, the precursor in the non-masked portion is imidated.

Next, the target polyimide pattern is formed by dissolving and removing the mask and the polyimide precursor covered by said mask.

The solvent for dissolving and removing the mask and the unimidized polyimide precursor is exemplified by N-methyl-2-pyrrolidone (NMP), dimethylformamide (DMF), dimethylacetamide (DMAC), dimethyl sulfoxide (DMSO), dimethyl sulfate, sulfolane, butyrolactone, cresol, phenol, halogenated phenol, cyclohexane, dioxane, tetrahydrofuran, acetophenone, tetramethylammonium hydroxide, or a solution of sodium silicate.

It is important to select a suitable one of these solvents for the mask material because the mask materials have different solubilities depending upon their nature.

Some of the imidizing reagents may form an isoimide ring and also have highly different solubilities from the polyamic acid but can nevertheless form the desired pattern. The isoimide ring can be easily converted into an imide ring by post heat treatment.

In the present invention a period of chemical imidization may vary depending on the thickness of the precursor film, film forming conditions, imidization temperature, etc. Generally, if thin films are 1 μm or less, 0° to 80° C. for about 1 minute may be sufficient; but in case of thick films such 5 μm or more, 10 hours or more at the same temperature may be preferable.

As the mask material, there may be used conventional photo-resists. Such photo-resists are exemplified by a negative resist such as water-soluble photo-resist of dichromate or water-soluble photo-resist other than dichromate. Alternatively, a positive resist is prepared by dissolving ester sulfonate of naphthoquinone-diazide compound and novolak resin in a cellosolve solvent, and also paint can be used for this purpose.

Depending upon the particular process, the mask material may be a metal such as Al, Cr, Cu or In, or an inorganic film such as $SiO_2$, SiN, TiN or C. When one of these metals or inorganic films is used as the mask material, it cannot be removed by dissolving it in the solvents mentioned above. It is necessary to remove first the mask material of the metal or inorganic film and then the underlying polyimide precursor. For example, an aluminium mask is removed using an aqueous solution of a mixture of phosphoric, acetic and nitric acids, and a $SiO_2$ mask is removed using an aqueous solution of hydrofluoric acid.

As mentioned, the important function of the mask is that the penetration rate of the imidizing reagent into it is far lower than that of the polyimide precursor. A mask material blended with a silicone resin or the like has a poor effect because the imidizing reagents penetrates into the mask but can have its masking effect enhanced by having its surface treated with oxygen plasma so that an $SiO_2$ layer is formed on its surface.

The present invention can be utilized for forming a pattern having an accuracy of 2 μm or more, such as an insulating film of an electronic device.

Pattern sizes or the minimum width of the paterned polyimide film may depend upon a dissolving maginitude of masks used, a thickness of the film of precursor, etc, because the chemical imidizing reagent diffuses into the precursor film and the agent may permeates beneath the mask more or less. Therefore, the minimum width of the resulting patterned polyimide film may be approximately equal to the thickness of the precursor film. However, according to the present invention, the sectional figure of the patterned film will become a reverse tapered, that is, the upper width of the resulting polyimide film is wider than that of the lower width, but after heat treatment of the film, the sectional figure will become nearly rectangular. This phenomenon is a benefit for the pattern resolution.

Some examples of applications of the invention are:
(1) insulating film of a semiconductor device,
(2) α-ray shielding film of LSI, e.g. a memory device,
(3) wiring insulating film of a thin film magnetic head,
(4) insulating film of heat-sensitive head of a facsimile machine or the like,
(5) wiring insulating film of substrate of high density packaging,
(6) insulating film of magnetic bubble memory element,
(7) substrate of a flexible printed board, and
(8) carrier film of IC and LSI.

BRIEF INTRODUCTION OF THE DRAWINGS

Embodiments of the invention will now be described by way of non-limitative example with reference to the accompanying drawings, 10 in which:

FIGS. 1(a), 1(b), 1(c), 1(d), and 1(e) schematically show stages in the formation of a paterened polyimide film by one typical process of the invention;

DESCRIPTION OF THE PREFERRED EMBODIMENTS

First, one typical process of the invention is described with reference to FIGS. 1(a)–(e).

Figure 1A:
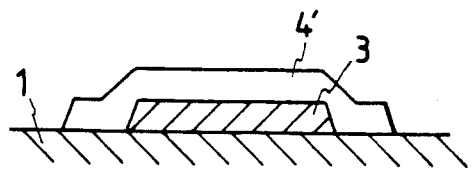

As shown in FIG. 1(a), there is formed on a substrate silicon wafer 1 a wiring layer 3 of aluminium 3 coated with a polyimide precursor film 4'. This film 4' has a thickness of 5 to 50 μm and is prepared by reacting 1 mol of aromatic diamine and 1 mol of aromatic tetracarboxylic dianhydride, in N-methyl-2-pyrrolidone (NMP) at 0° to 50° C., and spin-coating the precursor varnish obtained, followed by a heat treatment for drying at 150° C. for 1 hour. Specific examples of the reactants are given below in the Examples.

Figure 1B:
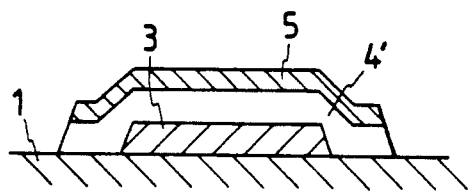

FIG. 1(b) shows a photo-resist layer 5 prepared by spin-coating the entire surface of the polyimide precursor film 4' of FIG. 1(a) with positive resist (OFPR800 of Tokyo Ohka Kogyo) and by drying the layer produced at 90° to 100° C. for 30 minutes.

Figure 1C:
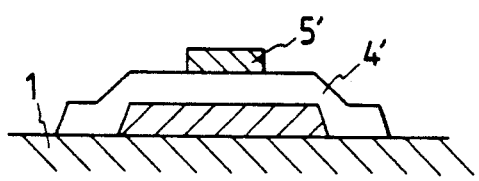

FIG. 1(c) shows the negative photo-resist layer 5, formed by exposure and development on the corresponding portion of the polyimide precursor 4' of FIG. 1(b). The function of the layer 5 is here to enable formation in the polyimide film so as to form a connecting hole 6 of 20 μm width as shown in FIG. 1(e) for connection with an external conductor.

The portion of the layer 5 other than at the location of the connecting hole 6 was exposed to an ultraviolet lamp (of white colour, 500 W, produced by Dainippon Kaken) for 30 seconds and then developed with a developer NWD-3 for OFPR (of Tokyo Ohka Kogyo). As a result, the exposed portion of the photo-resist layer 5 was dissolved and removed.

Figure 1D:
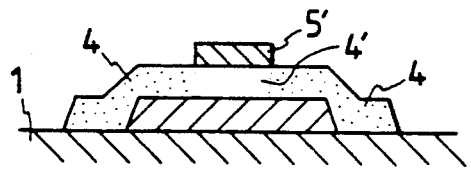

FIG. 1(d) shows the polyimide film 4 formed by dipping the structure of FIG. 1(c) in the chosen imidizing reagent (illustrated below) for a predetermined time at room temperature to imidize all the polyimide precursor 4' except the portion coated with the photo-resist layer 5'.

Figure 1E:
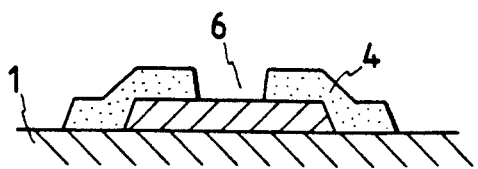

FIG. 1(e) shows the polyimide pattern having the desired connecting hole 6 obtained by dipping the photo-resist layer 5' of FIG. 1(d) and the polyimide precursor film 4' of the unimidized portion in a selective solvent (NMP) to dissolve and remove them.

In this present embodiment, the photo-resist and the polyimide precursor film were removed with one solvent but they may be respectively dissolved and removed with two different solvents.

EXAMPLES

The present invention is illustrated below in more detail by the following non-limitative examples.

In each Example, the steps of FIGS. 1(a) to (e) were performed as described above using the materials and the conditions set out in Tables 1 and 2.

Satisfactory insulating layers of polyimide were obtained in each case.

TABLE 1

| | Polyimide components | | | | | |
|---|---|---|---|---|---|---|
| | aromatic diamine | | aromatic tetracarboxylic dianhydride | | Drying temp. | Polyimide thickness |
| Example No. | Kind | mol | Kind | mol | (°C.) | (μm) |
| 1 | DDE | 1.0 | PMDA | 1.0 | 150 | 5.0 |
| 2 | DDE | 1.0 | PMDA | 1.0 | 150 | 20.0 |
| 3 | DDE | 1.0 | PMDA | 1.0 | 150 | 50.0 |
| 4 | p-PDA | 1.0 | s-BPDA | 1.0 | 150 | 5.0 |

TABLE 1-continued

| | Polyimide components | | | | | |
|---|---|---|---|---|---|---|
| Example No. | aromatic diamine Kind | mol | aromatic tetra-carboxylic dianhydride Kind | mol | Drying temp. (°C.) | Polyimide thickness (μm) |
| 5 | p-PDA | 1.0 | s-BPDA | 1.0 | 150 | 15.0 |
| 6 | p-PDA | 1.0 | s-BPDA | 1.0 | 150 | 40.0 |
| 7 | p-PDA | 1.0 | BPDA | 1.0 | 150 | 5.0 |
| 8 | DATO | 1.0 | s-BPDA | 1.0 | 150 | 5.0 |
| 9 | o-TLD | 1.0 | s-BPDA | 1.0 | 150 | 5.0 |
| 10 | DDM | 1.0 | s-BPDA | 1.0 | 150 | 5.0 |

DDE = 4,4'-diaminodiphenylether
p-PDA = p-phenylenediamine
DATO = 2,5-diaminotoluene
o-TLD = o-tolidine
DDM = 4,4'-diaminodiphenylmethane
PMDA = pyromellitic dianhydride
s-BPDA = 3,3',4,4'-biphenyltetracarboxylic dianhydride
BTDA = 3,3',4,4'-benzophenonetetracarboxylic dianhydride

TABLE 2

| Example No. | Mask Material | Imidizing agent Kind (vol. ratio) | | dipping time (h) |
|---|---|---|---|---|
| 1 | OFPR 800 | acetic anhydride: phridine: | 50 50 | 24 |
| 2 | OFPR 800 | acetic anhydride: phridine: | 50 50 | 24 |
| 3 | OFPR 800 | acetic anhydride: pyridine: | 50 50 | 24 |
| 4 | OFPR 800 | acetic anhydride: pyyridine: butyl acetate: | 30 30 35 | 24 |
| 5 | OFPR 800 | acetic anhydride: pyridine: hexane: | 30 30 35 | 24 |
| 6 | OFPR 800 | acetic anhydride: pyridine: | 60 40 | 24 |
| 7 | OFPR 800 | acetic anhydride: pyridine: | 70 30 | 24 |
| 8 | OFPR 800 | acetic anhydride: pyridine: | 50 50 | 15 |
| 9 | OFPR 800 | acetic anhydride: pyridine: | 50 50 | 15 |
| 10 | OFPR 800 | acetic anhydride: pyridine: | 50 50 | 15 |

The embodiment explained above is production of a wiring substrate, but the present invention as will be described below can be applied to a variety of electronic and other devices.

Figure 2:
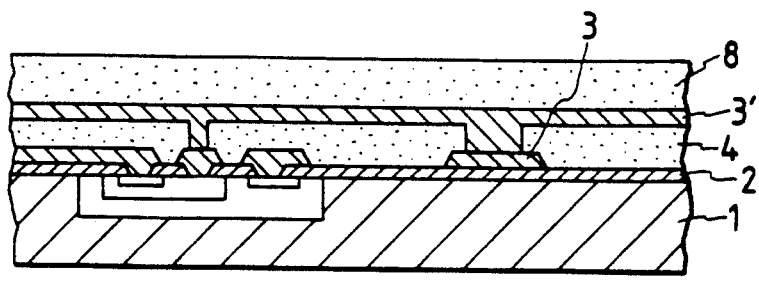
FIG. 2 is a sectional partial view of a LSI having a multilayered wiring structure and a polyimide film formed according to the invention.

FIG. 2 is a schematic sectional view of an LSI having a multi-layered wiring structure. A semiconductor substrate 1 having a patterned SiO₂ film 2 on its surface was given a metal coating film, the unnecessary portion of which was removed by a conventional etching method to form a first wiring layer 3 having a desired wiring pattern. This wiring layer 3 was thus electrically connected with a semiconductor element via through holes formed in predetermined portions of the SiO₂. Next, a polyimide precursor varnish was spin-coated and formed into a patterned polyimide film 4 as in the above Examples.

The polyimide film 4 was coated with a second wiring line 3' of metal film, which was electrically connected with the first wiring line 3 through the openings of the polyimide film 4, to make a circuit.

The element thus prepared was provided with a protective film made of an epoxy resin composition 8 to complete a semiconductor element having a two-layered wiring structure.

Although this element was provided with the protective layer made of an epoxy resin composition, this layer may be dispensed with.

Figure 3:
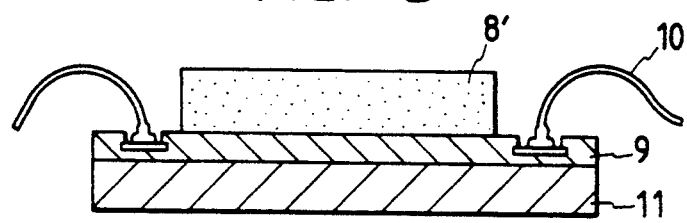
FIG. 3 is a sectional view of a memory device having an α-ray shielding film of polyimide formed according to the invention.

FIG. 3 is a sectional view of a memory element having an α-ray shielding film. A memory element 9 made of a silicon chip was fixed on a chip-supporting substrate 11 and was connected with external leads (not shown) through bonding wires 10. The memory element 9 was provided on its surface with a patterned α-ray shielding layer 8' which was made of polyimide film containing 1 ppb or less or uranium and thorium made by the process of the present invention. This α-ray shielding film had a thickness as large as 20 to 50 μm so that it was accompanied by problems that the etching method of the prior art took a long time and that the resist mask tended to separate. By applying the present invention, however, the time can be shortened to solve the problem of uneven film thickness and also the presence of residual etching resist.

The aforementioned memory element could be packaged, if necessary, by transfer-molding it with an epoxy resin composition.

Figure 4:
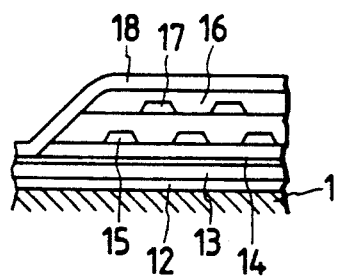
FIG. 4 is a partial sectional view of a thin-film magnetic head having wiring insulating layers of polyimide formed according to the invention.

FIG. 4 is a sectional view of a thin-film magnetic head. On a substrate 12 of alumina, a lower magnetic element 13 and a magnetic gap layer 14 of alumina were first disposed. Then there were formed conductor coils 15 and second conductor coils 17 which were insulated by polyimide inter-layer insulating films 16. The structure thus made was overlaid by an upper magnetic element 18.

The inter-layer insulating films 16 used were made of the polyimide film patterned by the process of the present invention Thus, the inter-layer insulating film was flat and degradation of the conductor coils was avoided. This remarkably reduced the level or height difference caused by the conductor coils, thereby reducing difficulties in construction of the device.

Moreover, the prior art process involving formation of the inter-layer insulating film 16 by the heat hardening of the polyimide precursor caused problems due to the effect of the heat and the degradation of the conductor coils resulting from the etching of the pattern formation. These problems are solved by the present invention.

Figure 5:
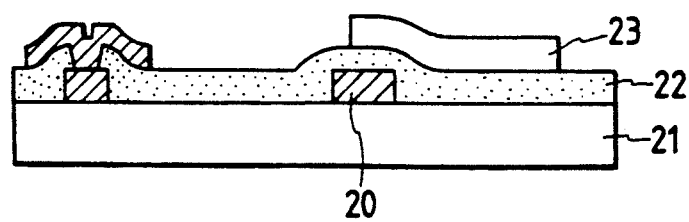
FIG. 5 is a sectional view of a bubble memory element having an insulating film of polyimide formed according to the invention.

FIG. 5 is a sectional view of a magnetic bubble memory element. A conductor 20 set on a garnet substrate 21 was covered with a patterned polyimide insulating film 22, which was overlaid by Permalloy 23. The insulating film 22 was provided as a polyimide pattern film by the process of the present invention. As a result, the conductor 20 was prevented from deterioration due to heating at a high temperature, so that the reliability of the magnetic bubble element was improved. The thermal stress between the polyimide insulating film and the substrate (of an inorganic material) could be reduced by using the film of polyimide of a low thermal expansion.

Figure 6:
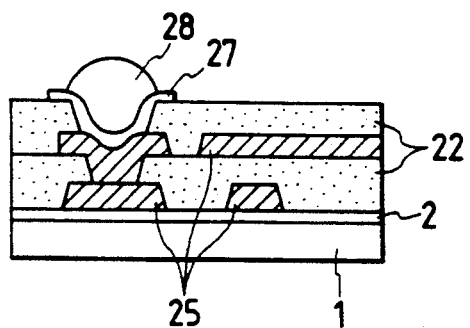
FIG. 6 is a partial sectional view of a highly dense polyimide wiring board with copper conductors, formed by a method of the present invention.

FIG. 6 is a sectional view of a highly dense wired board. The silicon wafer substrate 1 was overlaid by thermally oxidized SiO₂, which was covered with a first copper wiring line 25. Through the insulating film 22 was formed a second copper wiring line 25, which was overlaid by the insulating film 22. Moreover, a Pd/Sn electrode 28 was disposed on a film 27 composed of Cr/Ni/Au.

In the structure thus made, the insulating films 22 were made of polyimide pattern film formed by the process of the present invention.

If the polyamic acid is applied to the copper film and heated to set in the conventional manner, the copper is dissolved by the carboxylic acid contained in the polyamic acid to cause a problem that the dissolved copper thermally decomposes the imide ring to deteriorate the polyimide film. The present invention substantially avoids this problem because imidization is accomplished at a low temperature to eliminate the solution of copper.

Figure 7:
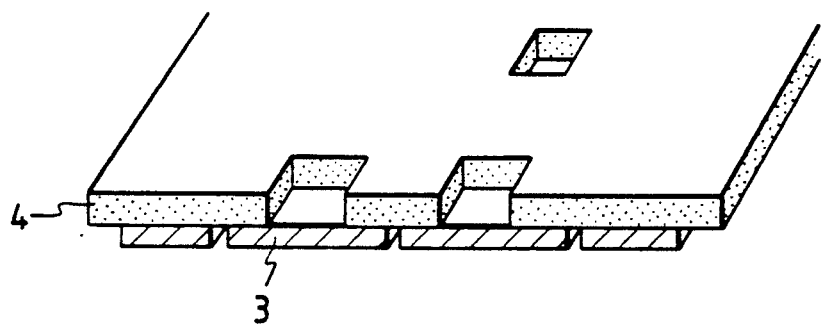
FIG. 7 is a partial sectional view of a flexible printed wiring board including a pattern of polyimide formed according to the invention.

FIG. 7 is a sectional view of a flexible printed board. Polyimide precursor varnish was directly applied to copper foil and dried by heating at 100° to 200° C. The precursor was formed into a pattern and then was chemically imidated by the process of the present invention to form the polyimide film 4. Thereafter the copper foil was etched to form a flexible printed circuit board having the wiring layer 3. Since the polyimide film 4 was formed at a low temperature, the copper foil was hardly oxidized and degraded and can be directly provided with the polyimide film so that the flexible printed board obtained had a high bonding strength.

Figure 8:
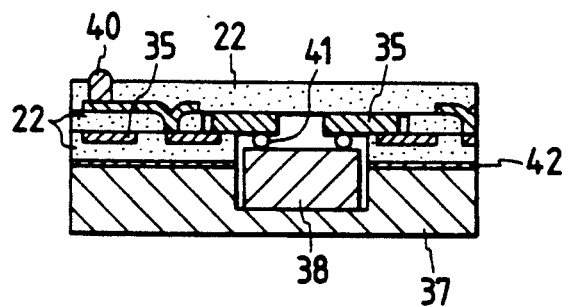
FIG. 8 is a partial sectional view of a printed wiring board containing a packaged LSI, with insulating layers of polyimide formed according to the invention.

FIG. 8 is a sectional view of a printed wiring board having an LSI. An LSI 38 was buried in a metallic substrate 37 by the film carrier method. The LSI 38 which was connected through solder bumps and solder balls 41 to copper wiring lines 35. Other wiring is achieved by inter-layer connections leading for example to an external terminal 40. Three patterned polyimide films 22 are used to insulate the wiring. Since these inter-layer insulating films 22 which were adhered to the substrate by adhesive 42 were formed by the process of the present invention, a highly dense packaged substrate was obtained.

Moreover, the problem resulting from the reaction between copper and polyimide was eliminated as well as any damage to the LSI due to heating.

What is claimed is:

1. In a process of forming a patterned polyimide film on a substrate including the step of conversion of a polyimide precursor into polyimide, the improvement which comprises the steps of coating a mask on the film of the precursor of polyimide formed on the substrate, selectively converting the precursor into polyimide by contacting only an unmasked portion of the precursor with a chemical imidizing reagent for a time sufficient to effect imidization of the precursor over the entire thickness of the unmasked portion of the film, and then removing the precursor beneath the mask.

2. A process of forming a patterned polyimide film according to claim 1 wherein the film of the precursor of polyimide is formed by applying a solution of the precursor in at least one organic solvent to the substrate and then drying the solution to form a dry film of the precursor, the improvement further comprising contacting the dry precursor of polyimide with said chemical imidizing reagent.

3. A process of forming a patterned polyimide film according to claim 2, wherein said improvement further comprises contacting the dry film of the precursor of polyimide with the chemical imidizing reagent by dipping the masked film of the precursor of polyimide in a liquid chemical imidizing reagent.

4. A process of forming a patterned polyimide film comprising the steps of
    (a) forming a mask resistant to a chemical imidizing reagent on a film of polyimide precursor on a substrate,
    (b) contacting only an unmasked portion of said film with the chemical imidizing reagent to effect imidization of the precursor at the unmasked portion to form polyimide, and
    (c) forming said film into a pattern of a polyimide by removing the precursor at selected portions beneath the mask.

5. A process of forming a patterned polyimide film according to claim 4 wherein the film of the precursor of polyimide is formed by applying a solution of the precursor in at least one organic solvent to the substrate and then drying the solution to form a dry film of precursor, the improvement further comprising contacting the dry precursor of polyimide with said chemical imidizing reagent.

6. A process of forming a patterned polyimide film according to claim 5, wherein said improvement further comprises contacting the dry film of the precursor of polyimide with the chemical imidizing reagent by dipping the masked film of the precursor of polyimide in a liquid chemical imidizing reagent.

7. A process of forming a patterned polyimide film comprising the steps of
    (a) forming a film of polyimide precursor on a substrate,
    (b) forming a mask which is negative with respect to the desired pattern on said film,
    (c) contacting only unmasked portions of said film with a chemical imidizing reagent to effect imidization of the precursor at the unmasked portions thereby forming polyimide, and
    (d) removing said mask and masked portions of said film of polyimide precursor to leave the patterned polyimide film.

8. A process according to claim 7 wherein said step (c) is performed at a temperature in the range of from −20° to 100° C.

9. A process according to claim 7 comprising subsequently performing a heat treatment of the polyimide pattern at a temperature above the glass transition temperature of the polyimide.

10. A process according to claim 7 wherein the imidizing reagent is a liquid and the diffusion rate of said imidizing reagent is less in said mask than in said polyimide precursor.

11. A process according to claim 10 wherein the diffusion rate of said imidizing reagent in said mask is less than one-third of its diffusion rate in said polyimide precursor.

12. A process according to claim 7 wherein said polyimide precursor is partially imidized, prior to step (c).

13. A process according to claim 7 wherein said mask is formed of one of a metal and novolak resin.

14. A process according to claim 7 wherein said polyimide precursor comprises a polyamic acid or an imidizable derivative of a polyamic acid.

15. A process according to claim 7 wherein said imidizing reagent comprises at least a carboxylic acid anhydride and a tertiary amine.

16. A process according to claim 7 wherein said polyimide film has a thickness of 0.05 to 70 μm.

17. A process according to claim 7 wherein the minimum width of the precursor film is at least two times the thickness of said precursor film.

18. A process of forming a patterned polyimide film according to claim 7 wherein the film of precursor of polyimide is formed by applying a solution of the precursor in at least one organic solvent to the substrate and then drying the solution to form a dry film of precursor, the improvement further comprising contacting the dry precursor of polyimide with said chemical imidizing reagent.

19. A process of forming a patterned polyimide film according to claim 18, wherein said improvement further comprises contacting the dry film of the precursor of polyimide with the chemical imidizing reagent by dipping the masked film of the precursor of polyimide in a liquid chemical imidizing reagent.

20. A process of manufacture of an electronic device having a patterned polyimide insulation film which comprises forming a coating of a polyimide precursor on the electronic device, forming a mask on the coating, contacting unmasked portions of the polyimide precursor with a chemical imidizing reagent thereby converting the polyimide precursor into polyimide, and removing portions of the polyimide precursor beneath the mask.

21. A process according to claim 20, wherein substantially only said unmasked portions of said polyimide precursor are contacted with said chemical imidizing reagent.

22. A process of manufacture of a semiconductor device having at least two insulating layers of patterned polyimide and at least one patterned conductor layer interposed between the insulating layers, comprising forming a mask on each of the patterned polyimide precursor film corresponding to the insulating layers, bringing the precursor into contact with a chemical imidizing reagent thereby to effect imidization of the precursor at the exposed portions into polyimide, and removing the precursor beneath the mask to form a desired pattern.

23. A process of manufacture of a semiconductor memory device having an α-ray shielding layer in the form of a patterned polyimide film which comprises forming a coating of a polyimide precursor on the memory device, forming a mask on the coating, contacting unmasked portions of the polyimide precursor with a chemical imidizing reagent thereby converting the polyimide precursor into polyimide, and removing portions of the polyimide precursor beneath the mask.

24. A process according to claim 23, wherein substantially only said unmasked portions of said polyimide precursor are contacted with said chemical imidizing reagent.

25. A process of manufacture of a thin-film magnetic head comprising forming as thin films on a substrate a lower magnetic layer, a conductor layer, an upper magnetic layer and patterned insulating layers insulating said conductor layer from said upper and lower magnetic layers, wherein said patterned insulating layers are each formed by forming a coating of a polyimide precursor, forming a mask on the coating, contacting unmasked portions of the polyimide precursor with a chemical imidizing reagent thereby converting the polyimide precursor into polyimide, and removing portions of the polyimide precursor beneath the mask.

26. A process according to claim 25, wherein substantially only said unmasked portions of said polyimide precursor are contacted with said chemical imidizing reagent.

27. A process of manufacture of a heat-sensitive printing head comprising forming patterned insulating layers and wiring on a substrate, wherein each of said insulating layers is formed by forming a coating of a polyimide precursor, forming a mask on the coating, contacting unmasked portions of the polyimide precursor with a chemical imidizing reagent thereby converting the polyimide precursor into polyimide, and removing portions of the polyimide precursor beneath the mask.

28. A process according to claim 27, wherein substantially only said unmasked portions of said polyimide precursor are contacted with said chemical imidizing reagent.

29. A process of manufacture of a magnetic memory device comprising forming on a substrate a conductor pattern, a magnetic pattern and a patterned insulating layer between said conductor pattern and said magnetic pattern, wherein said patterned insulating layer is formed by forming a coating of a polyimide precursor, forming a mask on the coating, contacting unmasked portions of the polyimide precursor with a chemical imidizing reagent thereby converting the polyimide precursor into polyimide, and removing portions of the polyimide precursor beneath the mask.

30. A process according to claim 29, wherein substantially only said unmasked portions of said polyimide precursor are contacted with said chemical imidizing reagent.

31. A process of manufacture of a circuit board comprising forming a plurality of wiring layers and a plurality of patterned insulating layers on a ceramic substrate, wherein each of said patterned insulating layers is formed by forming a coating of a polyimide precursor, forming a mask on the coating, contacting unmasked portions of the polyimide precursor with a chemical imidizing reagent thereby converting the polyimide precursor into polyimide, and removing portions of the polyimide precursor beneath the mask.

32. A process according to claim 31, wherein substantially only said unmasked portions of said polyimide precursor are contacted with said chemical imidizing reagent.

33. A process of manufacture of a flexible circuit board comprising forming a patterned polyimide substrate and wiring thereon, wherein said substrate is formed by forming a polyimide precursor film, forming a mask on the film, contacting unmasked portions of the polyimide precursor film with a chemical imidizing reagent thereby converting the polyimide precursor into polyimide, and removing portions of the polyimide precursor beneath the mask.

34. A process according to claim 33, wherein substantially only said unmasked portions of said polyimide precursor are contacted with said chemical imidizing reagent.

35. A process of manufacture of a semiconductor element package comprising mounting a semiconductor element on a substrate, forming wiring connected to said element, forming at least one patterned insulating layer for said wiring and a patterned coating layer above said wiring, wherein each of said patterned insulating layers and said patterned coating layer is formed by providing a polyimide precursor film, forming a mask on the polyimide precursor film, contacting unmasked portions of the polyimide precursor film with a chemical imidizing reagent thereby converting the polyimide precursor into polyimide, and removing portions of the polyimide precursor beneath the mask.

36. A process according to claim 35, wherein substantially only said unmasked portions of said polyimide precursor are contacted with said chemical imidizing reagent.

* * * * *